United States Patent [19]
Fukuoka et al.

[11] Patent Number: 5,759,749
[45] Date of Patent: Jun. 2, 1998

[54] DEVELOPING METHOD AND DEVELOPING APPARATUS FOR OPTICAL RECORD MEDIUM

[75] Inventors: Satoru Fukuoka; Hiroyuki Kosaka, both of Yamanashi-ken, Japan

[73] Assignees: Pioneer Electronic Corporation; Pioneer Video Corporation, both of Japan

[21] Appl. No.: 822,234

[22] Filed: Mar. 21, 1997

Related U.S. Application Data

[63] Continuation of Ser. No. 606,401, Feb. 23, 1996, abandoned.

[30] Foreign Application Priority Data

Feb. 28, 1995 [JP] Japan ................................ 7-40369

[51] Int. Cl.$^6$ .................................................. G11B 7/26
[52] U.S. Cl. ............................ 430/321; 430/331; 430/326; 430/421
[58] Field of Search ............................ 430/320, 321, 430/326, 322, 421, 331

[56] References Cited

U.S. PATENT DOCUMENTS

| | | | |
|---|---|---|---|
| 3,961,101 | 6/1976 | Barton | 430/189 |
| 4,150,398 | 4/1979 | Kojima et al. | 430/945 |
| 4,613,561 | 9/1986 | Lewis | 430/192 |
| 4,822,722 | 4/1989 | Lewis et al. | 430/303 |

FOREIGN PATENT DOCUMENTS 1-214863  8/1989  Japan .

OTHER PUBLICATIONS

Elliot, David J., Integrated Cicuit Fabrication Technology McGraw-Hill pp. 214–229 1982.
Chiong et al., "Contrast and sensitivity...", J. Vac. Sci. Technol., B vol. 6(6) Nov./Dec. 1988.
Abstract of JP 01-214863.
Elliott "Integrated Circuit Fabrication Technology"(©1982) pp. 214–229.

*Primary Examiner*—Martin Angebranndt
*Attorney, Agent, or Firm*—Nixon & Vanderhye

[57] ABSTRACT

A photo-resist layer of positive type, which is formed by a predetermined thickness on a disc substrate and which is exposed by a light beam modulated in accordance with record information to produce an optical record medium comprising the photo-resist layer and the disc substrate, is developed by the developing method. The developing method includes the steps of: firstly developing the exposed photo-resist layer by alkaline developing solution which has a normality of 0.17 to 0.19N for a first time period such that the photo-resist layer be incompletely developed to a predetermined depth from a surface of the exposed photo-resist layer; firstly washing the firstly developed photo-resist layer to stop the firstly developing step, and firstly drying the firstly washed photo-resist layer; secondly developing the firstly dried photo-resist layer by the alkaline developing solution for a second time period which is longer than the first time period such that the photo-resist layer be completely developed to a pit depth; and secondly washing the secondly developed photo-resist layer to stop the secondly developing step, and drying the secondly washed photo-resist layer to produce the optical record medium recorded with the record information as a developed pit pattern.

5 Claims, 8 Drawing Sheets

FIG. 5

| EXAMPLE NO. | 1st DEVELOPING | 2nd DEVELOPING | JUDGEMENT OF PIT SHAPE |
|---|---|---|---|
| 1 | 0.18N, 10sec | 0.18N, 190sec | ○ |
| 2 | 0.18N, 20sec | 0.18N, 180sec | ◎ |
| 3 | 0.18N, 30sec | 0.18N, 170sec | ◎ |
| 4 | 0.18N, 40sec | 0.18N, 160sec | ◎ |
| 5 | 0.18N, 50sec | 0.18N, 150sec | ○ |
| 6 | 0.18N, 60sec | 0.18N, 140sec | ○ |
| 7 | 0.18N, 100sec | 0.18N, 100sec | △ |
| 8 | 0.17N, 30sec | 0.17N, 170sec | ◎ |
| 9 | 0.19N, 30sec | 0.19N, 170sec | ◎ |
| 10 | 0.24N, 30sec | 0.24N, 170sec | △ |
| 11 | 0.12N, 30sec | 0.12N, 170sec | △ |

◎: EXCELLENT  ○: SATISFACTORY  △: POOR

1st DEVELOPING

2nd DEVELOPING

DEVELOPING METHOD AND DEVELOPING APPARATUS FOR OPTICAL RECORD MEDIUM

This is a Rule 62 File Wrapper Continuation of application Ser. No. 08/606,401, filed 23 Feb. 1996, now abandoned.

BACKGROUND OF THE INVENTION

1. Field of the Invention

The present invention generally relates to a developing method and a developing apparatus for an optical record medium, and more particularly to the developing method and the developing apparatus used for producing a master disc of the optical disc, to which information can be recorded by a high density, such as a DVD (Digital Video Disc).

2. Description of the Related Art

The developing method for a master disc of the optical disc is performed as following.

Namely, at first, a glass substrate G is prepared, and a photo-resist layer P of positive type is formed by the spinner-coating technique with a predetermined thickness d. Then, the exposing process is performed by irradiating the photo-resist layer P with a light beam, which intensity is modulated in accordance with the record signal and is focused by an objective lens on the photo-resist layer P, such that a latent image corresponding to the light intensity distribution of the light beam (i.e. the distribution of the irradiated light beam having the light intensity higher than a predetermined threshold value Ia) is formed in the photo-resist layer P as shown in FIG. 6.

Then, the developing process is applied to the exposed photo-resist layer P by use of the alkaline developing solution, which normality is 0.3N, for several tens seconds as shown in FIG. 6.

Finally, the water-washing process is applied to the developed photo-resist layer P to stop the developing process, and the drying process is nextly applied to obtain the master disc 100a as shown in FIG. 6.

According to the above described developing method, since the developing process is performed for a relatively short time period by use of the alkaline developing solution, which concentration is relatively high, i.e. just one developing process is applied to complete the whole development of the photo-resist layer P, the portion of the photo-resist layer P, which has not been exposed in the exposing process, is also partially developed.

Thus, convex and concave portions and rugous portions are formed on the surface of the photo-resist layer P. Namely, the planarity of the master disc 100a is degraded.

Further, the edge of the developed photo-resist layer P is not sharp but rather rounded as shown in FIG. 6. Consequently, if a stamper 101a is formed by use of the above mentioned master disc 100a, the sharpness of the pit edge (or groove edge) of a pit portion 102a and the planarity of a land portion 103a are poor as shown in FIG. 7.

The poor sharpness of the pit edge and the poor planarity of the land portion lead to problems for producing the high density record type optical disc such as a DVD since the resolution of the pit detection is degraded by those poor sharpness and poor planarity.

A developing method, to improve the sharpness of the pit edge, is proposed by Japanese Patent Publication Hei 4-11, 024, in which two developing processes are applied separately.

Namely, the first developing process is applied to the exposed photo-resist layer P by use of the alkaline developing solution, which normality is 0.2 to 0.3N. More concretely, the alkaline developing solution is sprayed onto the photo-resist layer P for 5 to 10 seconds, to perform the partial development until the development of the photo-resist layer P reaches the surface of the glass substrate G as shown in FIG. 8A. Then, the water-washing process is applied to this developed photo-resist layer P.

Then, the second developing process is applied to the water-washed photo-resist layer P by use of the alkaline developing solution, which normality is 0.2. to 0.3N. More concretely, the alkaline developing solution is sprayed onto the photo-resist layer P for 40 to 100 seconds until the edge of the developed portion of the photo-resist layer P becomes sharp as shown in FIG. 8B. Then, the water-washing process is applied to this developed photo-resist layer P, and the drying process is applied to obtain a master disc 100b.

According to the above explained developing method of Japanese Patent Publication Hei 4-11,024, by performing two separated developing processes, the sharpness of the pit edge can be slightly improved. However, the aforementioned planarity of the surface of the photo-resist layer P is hardly improved in comparison with the case of FIG. 7 since the concentration of the developing solution is relatively high. Further, since the first developing process is applied until the surface of the glass substrate G is exposed, the development is progressed to a large extent, so that the sharpness of the pit edge and the planarity of the surface of the photo-resist layer P are degraded, resulting in that the effect of the second developing process, which is separated from the first developing process, is very little.

SUMMARY OF THE INVENTION

It is therefore an object of the present invention to provide a developing method and developing apparatus for an optical record medium, which can improve the sharpness of the pit edge and the planarity of the surface of the developed photo-resist layer.

The above object of the present invention can be achieved by a developing method of developing a photo-resist layer of positive type, which is formed by a predetermined thickness on a disc substrate and which is exposed by a light beam modulated in accordance with record information to produce an optical record medium comprising the photo-resist layer and the disc substrate. The developing method includes the steps of: firstly developing the exposed photo-resist layer by alkaline developing solution which has a normality of 0.17 to 0.19N for a first time period such that the photo-resist layer be incompletely developed to a predetermined depth from a surface of the exposed photo-resist layer; firstly washing the firstly developed photo-resist layer to stop the firstly developing step, and firstly drying the firstly washed photo-resist layer; secondly developing the firstly dried photo-resist layer by the alkaline developing solution for a second time period which is longer than the first time period such that the photo-resist layer be completely developed to a pit depth; and secondly washing the secondly developed photo-resist layer to stop the secondly developing step, and drying the secondly washed photo-resist layer to produce the optical record medium recorded with the record information as a developed pit pattern.

According to the developing method of the present invention, the exposed photo-resist layer is firstly developed by the alkaline developing solution which has a normality of 0.17 to 0.19N for a first time period. By this step, the photo-resist layer is incompletely or slightly developed to a predetermined depth from its surface. Then, the firstly developed photo-resist layer is firstly washed to stop the firstly developing step, and the firstly washed photo-resist layer is dried. Nextly, the firstly dried photo-resist layer is developed by the alkaline developing solution for a second time period, which is longer than the first time period. By this, the photo-resist layer is completely developed to the pit depth. The secondly developed photo-resist layer is secondly washed to stop the secondly developing step, and the secondly washed photo-resist layer is dried to produce the optical record medium recorded with the record information as a developed pit pattern. Therefore, since the surface of the exposed photo-resist layer is reformed by the first developing step, and the development is completed by applying the secondly developing process to the reformed photo-resist layer, the pit edge of the optical record medium becomes sharp. Further, since the alkaline developing solution, which concentration is relatively low (i.e. 0.17 to 0.19N), is used in the first and second developing steps, the rugosity of the surface of the photo-resist layer can be reduced, according to the developing method of the present invention.

As one aspect of the developing method of the present invention, the first time period is 10 seconds to 60 seconds, and the second time period is 100 seconds to 300 seconds. In this case, the excellent sharpness of the pit edge and the excellent planarity of the land portion of the optical record medium can be obtained.

As another aspect of the developing method of the present invention, the photo-resist layer, which has a thickness set on the basis of the pit depth and a wave length of the light beam, may be developed by the firstly developing step. Thus, the developed pit pattern having the desirable pit depth can be obtained on the optical record medium.

As another aspect of the developing method of the present invention, the developing method further includes the step of pre-washing the exposed photo-resist layer before the firstly developing step to improve a wettability of the exposed photo-resist layer with respect to the alkaline developing solution. In this case, the wettability of the surface of the exposed photo-resist layer can be improved with respect to the developing solution by the pre-washing process, so that the firstly developing step can be reliably performed.

As another aspect of the developing method of the present invention, the optical record medium comprises a master disc for an optical disc. In this case, the master disc which has the sharp pit edge and the plane land portion can be obtained by the developing method, and the optical disc which has the sharp pit edge and the plane land potion can be obtained by forming a stamper from the master disc.

As another aspect of the developing method of the present invention, each of the firstly and secondly developing steps includes the step of supplying the alkaline developing solution onto a surface of the photo-resist layer while rotating the disc substrate. Thus, the developing steps can be reliably and uniformly applied on the surface of the photo-resist layer.

As another aspect of the developing method of the present invention, each of the firstly and secondly washing steps includes the step of supplying pure water onto a surface of the photo-resist layer while rotating the disc substrate. Thus, the washing steps can be reliably and uniformly applied on the surface of the photo-resist layer.

The above object of the present invention can be also achieved by a developing apparatus for developing a photo-resist layer of positive type, which is formed by a predetermined thickness on a disc substrate and which is exposed by a light beam modulated in accordance with record information to produce an optical record medium comprising the photo-resist layer and the disc substrate. The developing apparatus is provided with: a first developing device for firstly developing the exposed photo-resist layer by alkaline developing solution which has a normality of 0.17 to 0.19N for a first time period such that the photo-resist layer be incompletely developed to a predetermined depth from a surface of the exposed photo-resist layer; a first washing and drying device for firstly washing the firstly developed photo-resist layer to stop a firstly developing operation of the first developing device, and firstly drying the firstly washed photo-resist layer; a second developing device for secondly developing the firstly dried photo-resist layer by the alkaline developing solution for a second time period which is longer than the first time period such that the photo-resist layer be completely developed to a pit depth; and a second washing and drying device for secondly washing the secondly developed photo-resist layer to stop a secondly developing operation of the second developing device, and drying the secondly washed photo-resist layer to produce the optical record medium recorded with the record information as a developed pit pattern.

According to the developing apparatus of the present invention, the exposed photo-resist layer is firstly developed by the alkaline developing solution which has a normality of 0.17 to 0.19N for a first time period by the firstly developing device. By this step, the photo-resist layer is incompletely or slightly developed to a predetermined depth from its surface. Then, the firstly developed photo-resist layer is firstly washed to stop the firstly developing step, and the firstly washed photo-resist layer is dried by the firstly washing and drying device. Nextly, the firstly dried photo-resist layer is developed by the alkaline developing solution for a second time period, which is longer than the first time period by the second developing device. By this, the photo-resist layer is completely developed to the pit depth. The secondly developed photo-resist layer is secondly washed to stop the secondly developing step, and the secondly washed photo-resist layer is dried to produce the optical record medium recorded with the record information as a developed pit pattern by the secondly washing and drying device. Therefore, since the surface of the exposed photo-resist layer is reformed by the first developing device, and the development is completed by applying the secondly developing process to the reformed photo-resist layer, the pit edge of the optical record medium becomes sharp. Further, since the alkaline developing solution, which concentration is relatively low (i.e. 0.17 to 0.19N), is used in the first and second developing devices, the rugosity of the surface of the photo-resist layer can be reduced, according to the developing apparatus, just in the same manner as in the above described developing method of the present invention.

The nature, utility, and further features of this invention will be more clearly apparent from the following detailed description with respect to preferred embodiments of the invention when read in conjunction with the accompanying drawings briefly described below.

BRIEF DESCRIPTION OF THE DRAWINGS

FIG. 5 is a table showing a result of an experiment according to the embodiment;

DETAILED DESCRIPTION OF THE PREFERRED EMBODIMENT

Referring to the accompanying drawings, an embodiment of the present invention will be now explained.

Figure 1:
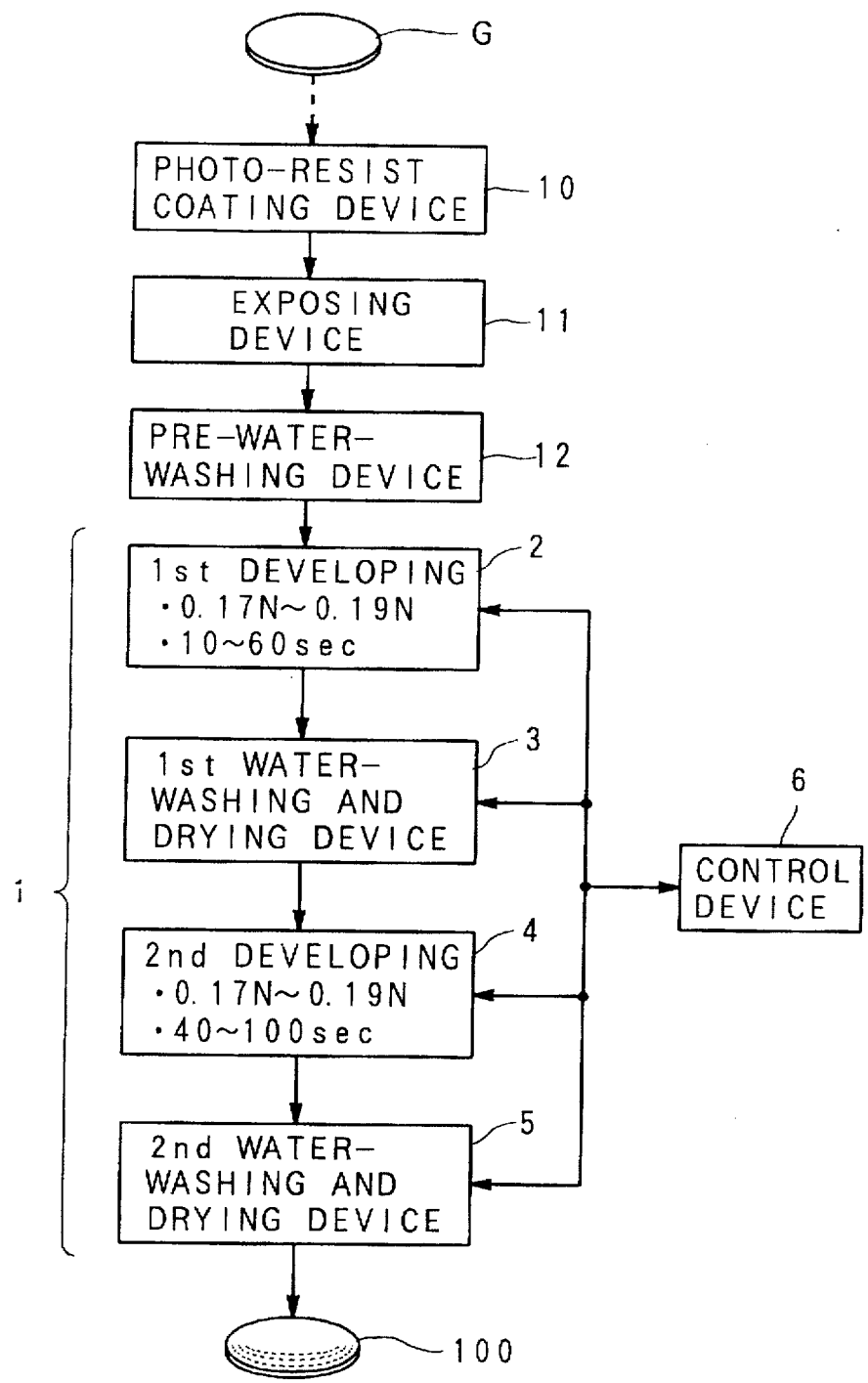
FIG. 1 is a block diagram of a developing apparatus as an embodiment of the present invention.

FIG. 1 shows a construction of a developing apparatus as an embodiment of the present invention.

In FIG. 1, a developing apparatus 1 is equipped in a master disc production apparatus.

The developing apparatus 1 is provided with: a first developing device 2; a first water-washing and dying device 3; a second developing device 4; a second water-washing and drying device 5; and a control device 6.

At the prior stage of the developing apparatus 1, a photo-resist coating device 10, an exposing device 11 and a pre-water-washing device 12 are equipped in the master disc production apparatus.

The photo-resist coating device 10 is constructed to form a photo-resist layer P of positive type, which has a thickness d set on the basis of the pit depth after developing and the wave length of the light beam used in the exposing device 11, on a glass substrate G. The exposing device 11 is constructed to form a latent image in the photo-resist layer P by irradiating the photo-resist layer P with the light beam, which is modulated in accordance with the record information. The pre-water-washing device 12 is constructed to wash the exposed photo-resist layer P by water to improve the wettability of the photo-resist layer with respect to the developing solution used in the developing apparatus 1.

The first developing device 2 is constructed to apply a first developing process to the exposed photo-resist layer P on the glass substrate G, on which the latent image is formed by the photo-resist coating device 10 and the exposing device 11, by use of the alkaline developing solution. The normality of this developing solution is in the range of 0.17 to 0.19N. The first developing process is applied for a first predetermined time period (e.g. 10 to 60 seconds) to develop the photo-resist layer P incompletely to its predetermined depth, which is much less than the thickness d of the photo-resist layer P, from its surface.

The first water-washing and drying device 3 is constructed to wash the developed photo-resist layer P by water so as to stop the development by the developing solution supplied by the first developing device 2, and dry the washed photo-resist layer P.

The second developing device 4 is constructed to apply a second developing process to the dried photo-resist layer P on the glass substrate G by use of the alkaline developing solution. The normality of this developing solution is in the range of 0.17 to 0.19N. The second developing process is applied for a second predetermined time period (e.g. 40 to 100 seconds), which is longer than the first predetermined time period, to develop the photo-resist layer P completely until the surface of the glass substrate G is exposed at the developed portion.

The second water-washing and drying device 5 is constructed to wash the developed photo-resist layer P by water so as to stop the development by the developing solution supplied by the second developing device 4, and dry the washed photo-resist layer P, so that a master disc 100 as an optical record medium is finally obtained.

The control device 6 is constructed to perform the overall control in the developing apparatus 1. The control device 6 may be constructed to further control the photo-resist coating device 10, the exposing device 11 and the pre-water-washing device 12.

Nextly, the operation of the developing apparatus 1 of the present invention will be explained with referring to FIGS. 1 to 3.

Figure 2:
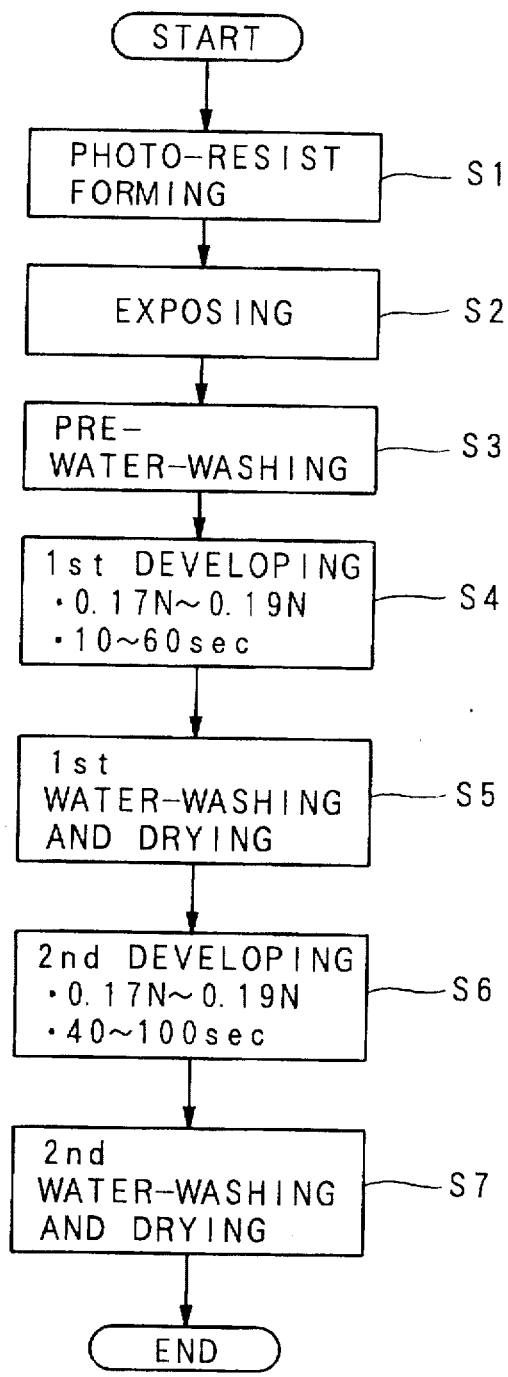
FIG. 2 is a flow chart showing an operation of the embodiment.
Figure 3A:
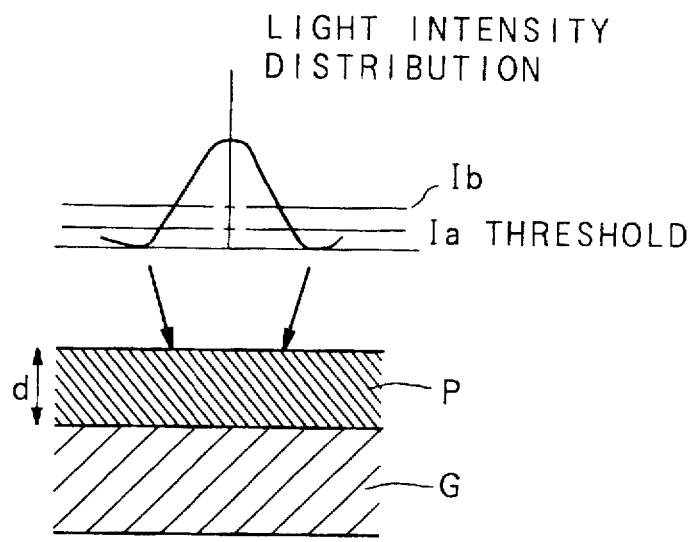
FIG. 3, which consist of FIGS. 3A to 3C, are diagrams sequentially showing the developing method of the embodiment.

In FIG. 2, prior to the developing process, the photo-resist layer P of positive type, which has the thickness d set on the basis of the pit depth after development and the wave length of the light beam used in the exposing process, is formed on the glass substrate G by the photo-resist coating device 10 as shown in FIG. 3A (step S1). In FIG. 3A, the light intensity distribution of the light beam emitted by the exposing device 11 is also illustrated.

More concretely, the photo-resist of positive type (e.g. AZ-1350 made by Hoechst AG corporation) is spinner-coated on the glass substrate G to be the photo-resist layer P having the thickness d of about 70 to 150 nm in the step S2.

In this case, the thickness d of the photo-resist layer P is set optimum for the wave length of the light beam used in the exposing device 11. For example, in case that the pit depth is set about ¼ of the wave length of the light beam and that a red laser light beam having the wave length of 670 nm is utilized, the thickness of about 120 nm, which corresponds to the ¼ of the wave length, is employed as the optimum thickness d.

Then, the latent image is formed by exposing the photo-resist layer P by irradiating it with the light beam, which is modulated in accordance with the record information by the exposing device 11 (step S2).

Then, the pre-water-washing process is applied to the exposed photo-resist layer P by the pre-water-washing device 12 to improve the wettability of the photo-resist layer P with respect to the developing solution (step S3).

More concretely, the glass substrate G formed with the exposed photo-resist layer P is placed on a turn table of the pre-water-washing device 12, and is rotated by about 100 rpm, while the pure water is continuously sprayed onto the exposed photo-resist layer P to wash it in the step S3.

Nextly, the first development is performed for the first predetermined time period (e.g. 10 to 60 seconds) to slightly develop the photo-resist layer P to the predetermined depth from the surface by the alkaline developing solution by the first developing device 2 under the control of the control device 6. The alkaline developing solution has the normality in the range of 0.17 to 0.19N (step S4).

More concretely, the alkaline developing solution having the normality of 0.18N (e.g. 30% diluted solution of the AZ developer made by Hoechst AG corporation, which has the normality of 0.6N) is supplied by a constant flowing rate of 5 ml/sec onto the photo-resist layer P for 30 seconds, while the glass substrate G is rotated by 100 rpm.

Figure 3B:
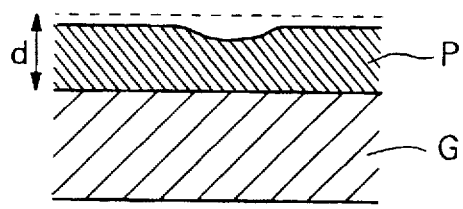

By this, the photo-resist layer P on the glass substrate G is slightly developed to the predetermined depth as shown in FIG. 3B.

After the first development, the first water-washing and drying processes are applied to the firstly developed photo-resist layer P by the first water-washing and drying device 3, to stop the development by the developing solution supplied by the first developing device 2 and dry the washed photo-resist layer P (step S5).

More concretely, pure water is supplied by a flowing rate of 80 ml/sec onto the surface of the photo-resist layer P for 150 seconds, while the turn table, on which the glass substrate G is placed, is rotated by 100 rpm to wash the photo-resist layer P by the pure water. Then, the washed photo-resist layer P is dried by rotating the turn table by 700 rpm for 90 seconds.

Nextly, the second development is performed for the second predetermined time period (e.g. 40 to 100 seconds) which is longer than the first predetermined time period to completely develop the photo-resist layer P to the predetermined development completion depth i.e. the pit depth by the alkaline developing solution, which is the same as that used in the first developing process, by the second developing device 4 under the control of the control device 6 (step S6).

More concretely, the alkaline developing solution having the normality of 0.18N is supplied by a constant flowing rate of 5 ml/sec onto the photo-resist layer P for 170 seconds, while the glass substrate G is rotated by 100 rpm.

After the second development, the second water-washing and drying processes are applied to the secondly developed photo-resist layer P by the second water-washing and drying device 5, to stop the development by the developing solution supplied by the second developing device 4 and dry the washed photo-resist layer P (step S7).

More concretely, pure water is supplied by a flowing rate of 80 ml/sec onto the surface of the photo-resist layer P for 150 seconds, while the turn table, on which the glass substrate G is placed, is rotated by 100 rpm, to wash the photo-resist layer P by the pure water. Then, the washed photo-resist layer P is dried by rotating the turn table by 700 rpm for 90 seconds.

Figure 3C:
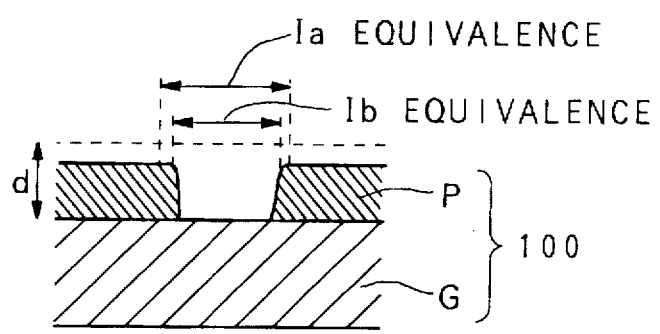

In this manner, the master disc 100, which has the developed photo-resist layer P on the glass substrate G and which has such a cross section as shown in FIG. 3C, is obtained. As shown in FIG. 3C, the sharpness of the edge portion of the master disc 100 is excellent.

Figure 4:
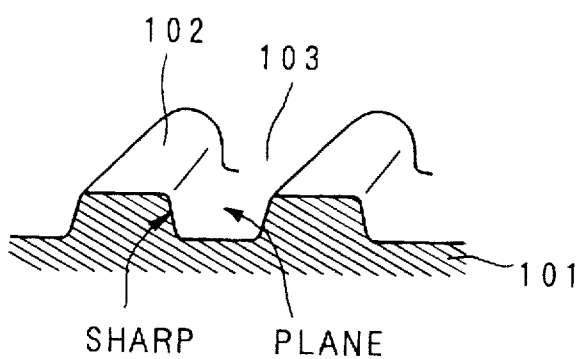
FIG. 4 is a partial perspective and sectional view of a stamper formed by a master disc developed by the embodiment.
Figure 7:
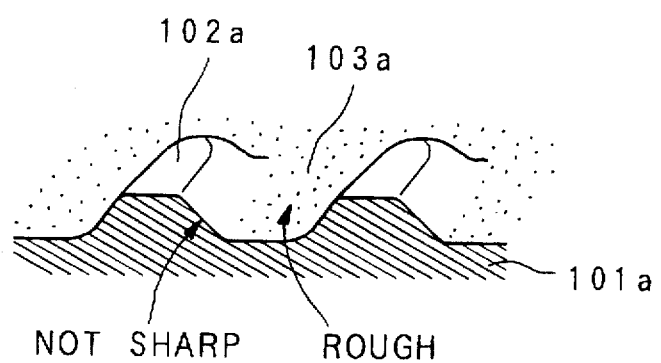
FIG. 7 is a partial perspective and sectional view of a stamper formed by a master disc developed by the related art of FIG. 6.
Figure 8A:
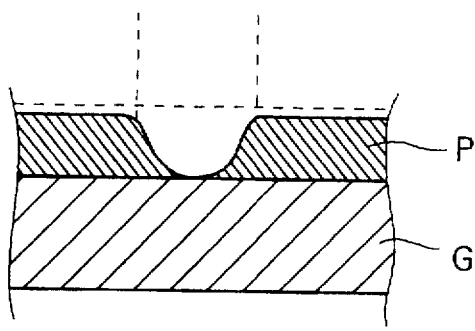
FIG. 8, which consist of FIGS. 8A and 8B, are diagrams sequentially showing the developing method of another related art.
Figure 8B:
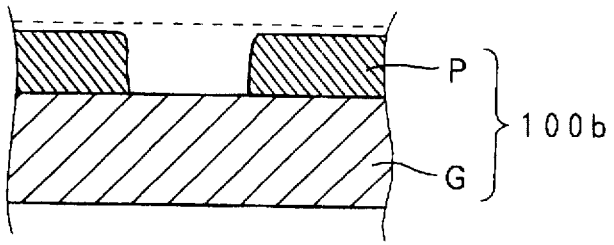

Thus, in case of forming a stamper 101 by use of the master disc 100, the pit edge (or the groove edge) of a pit portion 102 of the stamper 101 becomes sharp correspondingly as shown in FIG. 4, so that the cross talk between adjacent tracks be reduced even if the recording track pitch is narrowed to increase the recording density. Further, the planarity of a land portion 103 of the stamper 101 is also improved as shown in FIG. 4, so that the S/N (Signal to Noise ratio) is improved in this case. The excellent sharpness of the pit edge and the excellent planarity of the land portion can be easily understood by comparing the stamper 101 of FIG. 4 (which is obtained by the present embodiment) with that of FIG. 7 (which is obtained by the related art). In this manner, the master disc 100 is quite suitable for the optical disc of high recording density type such as a DVD.

In addition, according to the developing operation of the present embodiment, since the first and second developing processes are performed for a relatively long time period by use of the developing solution having a relatively low concentration, the process stability is also excellent.

The reason why the excellent sharpness of the pit edge and the excellent planarity of the land portion can be obtained in the present embodiment is explained hereinbelow.

Namely, the development of the surface portion of the photo-resist layer P is hardly progressed in the first development in the step S4 since the time period of the developing process is rather short and the concentration of the developing solution is rather low.

Figure 6:
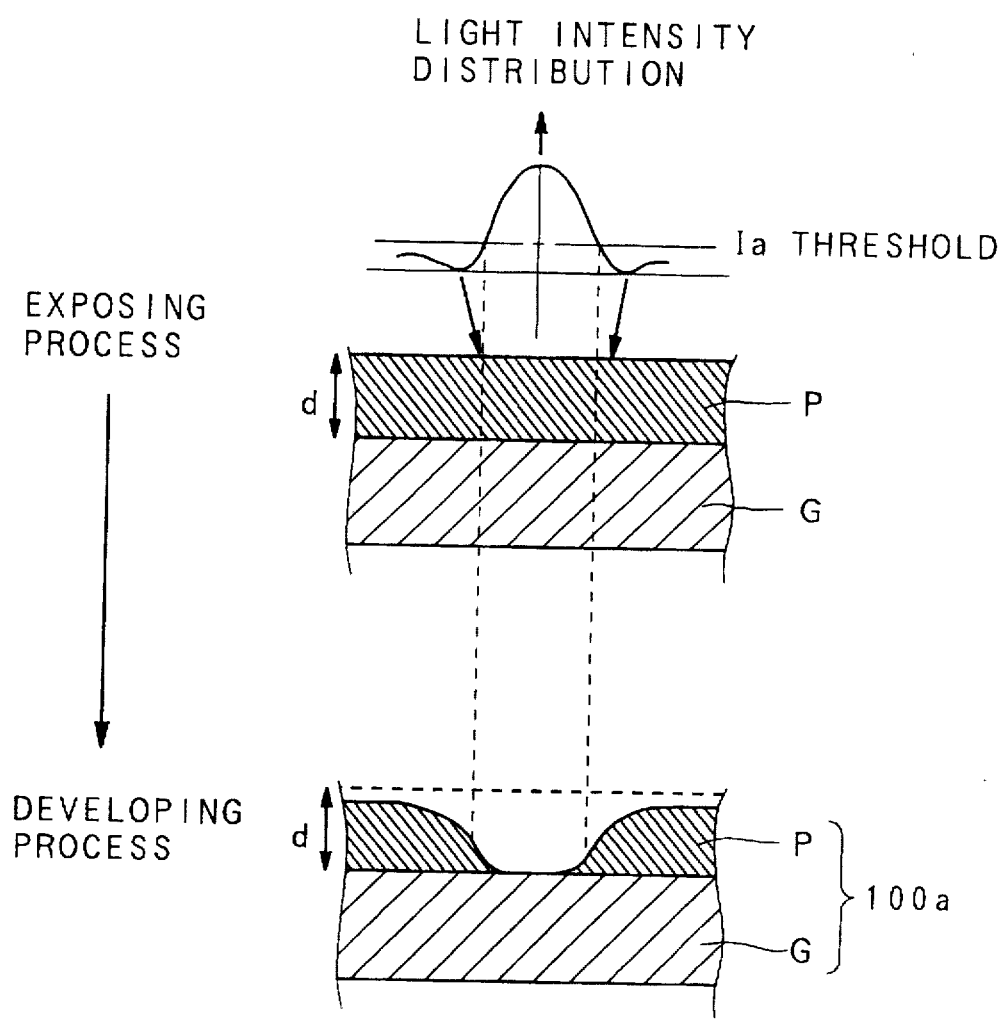
FIG. 6 is a diagram sequentially showing the developing method of one related art.

However, by the first development of the step S4, the surface of the photo-resist layer P is reformed so that the development can be progressed at the surface area exposed by the light intensity above a threshold Ib, in the main developing process (i.e. the second developing process) of the step S6, as shown in FIGS. 3A and 3C. If this slight development is not separately performed before the main development (i.e. the second development), the development will be progressed at the surface area exposed by the light intensity above the threshold Ia which is lower than the threshold Ib, in the developing process as shown in FIG. 6 (which is the case of the related art).

Namely, by applying the first slight developing process, the threshold of the development in the second developing process is raised, so that the second development can be performed by a high contrast.

Therefore, by use of the developing solution of relatively low concentration and by applying the double stage developments to the photo-resist layer P such that the surface of the photo-resist layer P is slightly developed by the first developing process and that the photo-resist layer P is mainly developed by the second developing process, the pit edge can be certainly sharpened and the rugosity of the surface of the photo-resist layer P can be certainly reduced.

[EXAMPLES OBTAINED BY EXPERIMENT]

Hereinbelow, examples obtained by an experiment to examine the optimum developing condition in the present embodiment will be explained.

FIG. 5 shows a table of developing conditions of the first developing process, developing conditions of the second developing process, and quality judgments of the corresponding pit shapes for various examples (examples No. 1 to 11).

As the developing condition, the concentration of the developing solution and the time period of the developing process are indicated in the table.

As the quality judgment of the pit shape, the mark "double circle" indicates that the pit shape is excellent, the mark "single circle" indicates that the pit shape is satisfactory, and the mark "triangle" indicates that the pit shape is poor according to the inspection of each pit shape by use of a microscope.

From those results in the table, the optimum developing condition can be concluded as following.

(i) the normality of the developing solution: 0.17 to 0.19N (ii) time period for the first developing process: 10 to 60 seconds (iii) time period for the second developing process: 140 to 190 seconds.

In the experiment, if the second developing time period is set to about 100 to 300 seconds, the substantially same result can be obtained although it is not indicated in the table of FIG. 5.

This is because the influence onto the result of the experiment of the first developing process is much stronger than that of the second developing process.

The reason why the optimum normality of the developing solution is set to 0.17 to 0.19N is as following. Namely, if the normality is lower than 0.17N, the required developing time period is too long in a practical sense. On the other hand, if the normality is higher than 0.19N, the effect to divide the developing process into two stages is drastically reduced.

The reason why the optimum developing time period of the first developing process is set to 10 to 60 seconds is as following. Namely, if it is less than 10 seconds, the photo-resist layer P is hardly developed, so that the effect of reforming the photo-resist layer P by the first developing process cannot be expected. On the other hand, if it is longer than 60 seconds, the first development progresses so that the effect to divide the developing process into two stages is drastically reduced.

Therefore, since the surface of the exposed photo-resist layer P is reformed by the first developing process, and the development is completed by applying the secondly developing process to the reformed photo-resist layer, the pit edge of the master disc 100 becomes sharp. Further, since the alkaline developing solution, which concentration is relatively low (i.e. 0.17 to 0.19N), is used in the first and second developing processes, the rugosity of the surface of the photo-resist layer P can be reduced, according to the present embodiment.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of developing a positive photo-resist layer, which is formed in a predetermined thickness on a disc substrate and which is exposed by a light beam modulated in accordance with record information to produce an optical record medium comprising the photo-resist layer and the disc substrate, said method comprising the successive steps of:
    (1) developing the exposed photo-resist layer with an alkaline developing solution which, has a normality of 0.17 to 0.19N, for 10 seconds to 60 seconds such that the photo-resist layer is incompletely developed to a predetermined depth from a surface of the exposed photo-resist layer;
    (2) washing the partially developed photo-resist layer of step (1) to stop the development, and drying the washed photo-resist layer;
    (3) further developing the dried photo-resist layer of step (2) with said alkaline developing solution for 100 seconds to 300 seconds such that the photo-resist layer is completely developed to a pit depth; and
    (4) washing the developed photo-resist layer of step (3) to stop the development, and drying the washed photo-resist layer to produce the optical record medium recorded with the record information as developed pit pattern.

2. The method according to claim 1, comprising the additional step of pre-washing the exposed photo-resist layer before developing step (1) to improve a wettability of the exposed photo-resist layer with respect to the alkaline developing solution.

3. The method according to claim 1, wherein said optical record medium comprises a master disc for an optical disc.

4. The method according to claim 1, wherein in developing steps (1) and (3) the alkaline developing solution is applied to a surface of the photo-resist layer while rotating the disc substrate.

5. The method according to claim 1, wherein in washing steps (2) and (4) pure water is supplied to a surface of the photo-resist layer while rotating the disc substrate.

* * * * *